United States Patent
Branch et al.

(10) Patent No.: US 6,744,639 B1
(45) Date of Patent: Jun. 1, 2004

(54) INTERNAL ELECTROMAGNETIC RADIATION SHIELD WITH GROUND CONNECTION FOR REMOVABLE SMALL FORM FACTOR TRANSCEIVERS

(75) Inventors: Scott Michael Branch, Rochester, MN (US); David Peter Gaio, Rochester, MN (US); Michael Francis Hanley, Rochester, MN (US); William K. Hogan, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/566,012

(22) Filed: May 5, 2000

(51) Int. Cl.⁷ ............................. H05K 9/00; H05K 7/14; H05K 7/18; H05K 5/00; H05K 5/04
(52) U.S. Cl. .................. 361/818; 361/816; 361/800; 361/753; 361/799
(58) Field of Search .................. 361/752, 753, 361/799, 800, 801, 816, 818, 683–686, 728, 796, 802, 807; 439/607, 609, 939; 174/35 GC, 35 R

(56) References Cited

U.S. PATENT DOCUMENTS 6,095,862 A * 8/2000 Doye et al. ............... 439/607

OTHER PUBLICATIONS

Removable Small Form Factor Fiber Optic Transceiver Module and Electromagnetic Radiation Shield, Ser. No. 09/489,184, filed Jan. 20, 2000, Scott M. Branch, David P. Gaio and William K. Hogan.
Improved Electromagnetic Radiation Grounding Shield for Opto–Electronic Components, Ser. No. , 09/565,086, filed on even date herewith David P. Gaio, Michael F. Hanley and Kenneth P. Jackson.
Enhanced Electromagnetic Interference Shield, Ser. No. 09/241,730, filed Feb. 2, 1999. by Timothy Duncan, John Mass, James L. Peacock and Scott Thorvilson.

* cited by examiner

Primary Examiner—Phuong T. Vu
(74) Attorney, Agent, or Firm—Allen, Dyer, Doppelt, Milbrath & Gilchrist, P.A.

(57) ABSTRACT

An electromagnetic radiation shield useful to attenuate or prevent the escape of electromagnetic radiation from the front of transceiver opto-electronic subassemblies resident in an opening or port in the housing of an electronic system is formed with both an aperture for each barrel of the opto-electronic subassemblies and a plurality of extensions projecting outwardly from the shield. The distal ends of the extensions are bent or shaped to form smoothly curved contact surfaces that project outside the transceiver module to make contact with a grounded member of the housing or other electrically grounded portion of the electronic system of which the transceiver module is a part. The electromagnetic radiation shield is assembled with the transceiver subassemblies and disposed within a transceiver module to be inserted into a communications port of a computer or server. The transceiver module contains elements that may generate and radiate electromagnetic energy. The electromagnetic energy must be prevented from escaping or attenuated to prevent electromagnetic interference in the other nearby electronic components or systems susceptible to electromagnetic interference.

20 Claims, 6 Drawing Sheets

INTERNAL ELECTROMAGNETIC RADIATION SHIELD WITH GROUND CONNECTION FOR REMOVABLE SMALL FORM FACTOR TRANSCEIVERS

CROSS REFERENCE TO CO-PENDING RELATED APPLICATIONS

The following applications are related applications:

U.S. Pat. No. 6,459,517 issued Oct. 1, 2001, entitled ENHANCED ELECTROMAGNETIC INTERFERENCE SHIELD, by Timothy Duncan, John Maas, James L. Peacock and Scott Thorvilson;

U.S. Pat. No. 6,335,869, filed Jan. 1, 2002, entitled REMOVABLE SMALL FORM FACTOR FIBER OPTIC TRANSCEIVER MODULE AND ELECTROMAGNETIC RADIATION SHIELD, by Scott M. Branch, David P. Gaio, and William K. Hogan; and U.S. patent application Ser. No. 09/565,096, filed May 5, 2000, entitled IMPROVED ELECTROMAGNETIC RADIATION GROUNDING SHIELD FOR OPTO-ELECTRONIC COMPONENTS, by David P. Gaio, Michael F. Hanley and Kenneth P. Jackson, all of which are incorporated herein in their entireties by this reference.

FIELD OF THE INVENTION

This invention relates to the field of electromagnetic radiation suppression and attenuation and, more specifically, to electromagnetic radiation shields disposed on removable communications connector components.

BACKGROUND OF THE INVENTION

Computers and servers are commonly connected to communications networks along with other computers and servers. The network and network connections typically are made with fiber optic cables. On occasion, such networks and network connections may be made using coaxial cable. The connections are made through communications ports in a wall of a system housing and there may be as many as 24 or more such ports on a typical computer or server.

Electrically grounded and serving as an enclosing electromagnetic radiation shield to attenuate, capture and ground the electromagnetic radiation radiated by conductors and electronic components, the system housing is partially prevented from performing attenuation and suppression function by necessary openings in the system housing. A communication port, one of the required openings, creates paths that allow electromagnetic radiation to escape from within the electronic system housing.

Internal electromagnetic radiation shields have been devised to prevent electromagnetic radiation escape from within the main computer housing; however, so long as connectors are required to be inserted into and removed from communication ports, mating connectors and associated signal lines and conductors will be required to be outside the internal shields, and escape paths will exist for unimpeded electromagnetic radiation radiated by the connector interfaces and conductors external to any internal electromagnetic radiation shielding associated with the communications port. The component materials of the transceiver module which interconnects the connector interface with the network data lines are typically not such that they provide adequate electromagnetic radiation shielding as installed and provide no electromagnetic radiation shielding at all once removed.

Dummy plugs with shielding properties have been considered, but they require adequate contact with a grounded component and are subject to being lost or misplaced, therefore not a good solution. Additionally, these dummy plugs are only useful if a transceiver module is removed from the communication ports.

A simple and reliable connection technique must be available to ground the electromagnetic radiation shield to be effective when a transceiver module is inserted into the communication port without any operator action other than simply inserting the transceiver module into a communication port.

OBJECTS OF THE INVENTION

It is an object of the invention to provide electromagnetic radiation shielding at a communications port opening in an electronics system housing.

It is another object of the invention to provide a simple and reliable grounding of the electromagnetic radiation shield to prevent electromagnetic radiation escape.

It is a further object of the invention to insure grounding of the electromagnetic radiation shield as a result of insertion of a shield-carrying component that other more expensive shielding may be eliminated.

It is still a further object of the invention to provide such electromagnetic radiation shielding that other more expensive shielding may be eliminated.

It is an additional object of the invention to provide a connection or ground path from the electromagnetic shield to the optical subassemblies when these subassemblies are conductive.

It is still another object of the invention to provide ground path connections to the optical subassemblies through stamped or coined fingers or slots.

Additional objects of the invention may become apparent and be recognized by one skilled in art.

SUMMARY OF THE INVENTION

This invention is an electromagnetic radiation shield which permits the projection therethrough of at least one interface and connection barrel of a connector member, thereby permitting the transmission of communication signals through the electromagnetic radiation shield while blocking or at least attenuating any electromagnetic radiation generated within the host electronic system and/or attempting to escape to the external environment.

The electromagnetic radiation shield is preferably a piece of flat sheet metal stock, such as steel or an alloy of steel with at least an aperture therethrough. The aperture is intended and is positioned and dimensioned to accept a barrel of a transceiver optical subassembly of an optoelectronic transceiver or an optical fiber which protrudes through the shield.

The electromagnetic radiation shield must be grounded to properly function in the collection of electromagnetic radiation and disposal of the electrical energy by conducting to ground any electrical current created by electromagnetic radiation in the electromagnetic radiation shield. The optoelectronic transceiver and its structural module must be insertable into and removable from the communication port of an electronic system, such as a computer or server, in order to accommodate both coaxial cable and fiber optic cable network connections. This removable/insertable characteristic of the transceiver prevents a permanent attachment and prevents grounding, by soldering or other permanent attachment techniques, of the electromagnetic radiation shield within the transceiver module to the electronic system enclosure.

In order to facilitate grounding and removal, the electromagnetic radiation shield is provided with a plurality of extensions which project outwardly, extending through openings in the module and beyond the module. The extensions are formed, bent or shaped to present curved spring-like contact portions that will wipingly engage a metal electromagnetic radiation shield structure to ground the electromagnetic radiation shield plate and still remain removable and interchangeable. As a part of the transceiver opto-electronic subassembly, the electromagnetic radiation shield is assembled into the transceiver module frame, which is preferably comprised of mating shells which fit over and receive the extensions, the opto-electronic transceiver and the electromagnetic radiation shield. Whenever the optical subassemblies (OSA's) are conductive, the electromagnetic radiation shield can make connections and ground the conductive optical subassemblies through the spring members formed by the coined or stamped fingers and/or slots.

A more complete and detailed understanding of the invention may be obtained from the attached drawings and the Detailed Description of the Invention to follow.

DESCRIPTION OF THE BEST MODE OF THE PREFERRED EMBODIMENT

FOR CARRYING OUT THE INVENTION AS CONTEMPLATED BY THE INVENTORS

Figure 1:
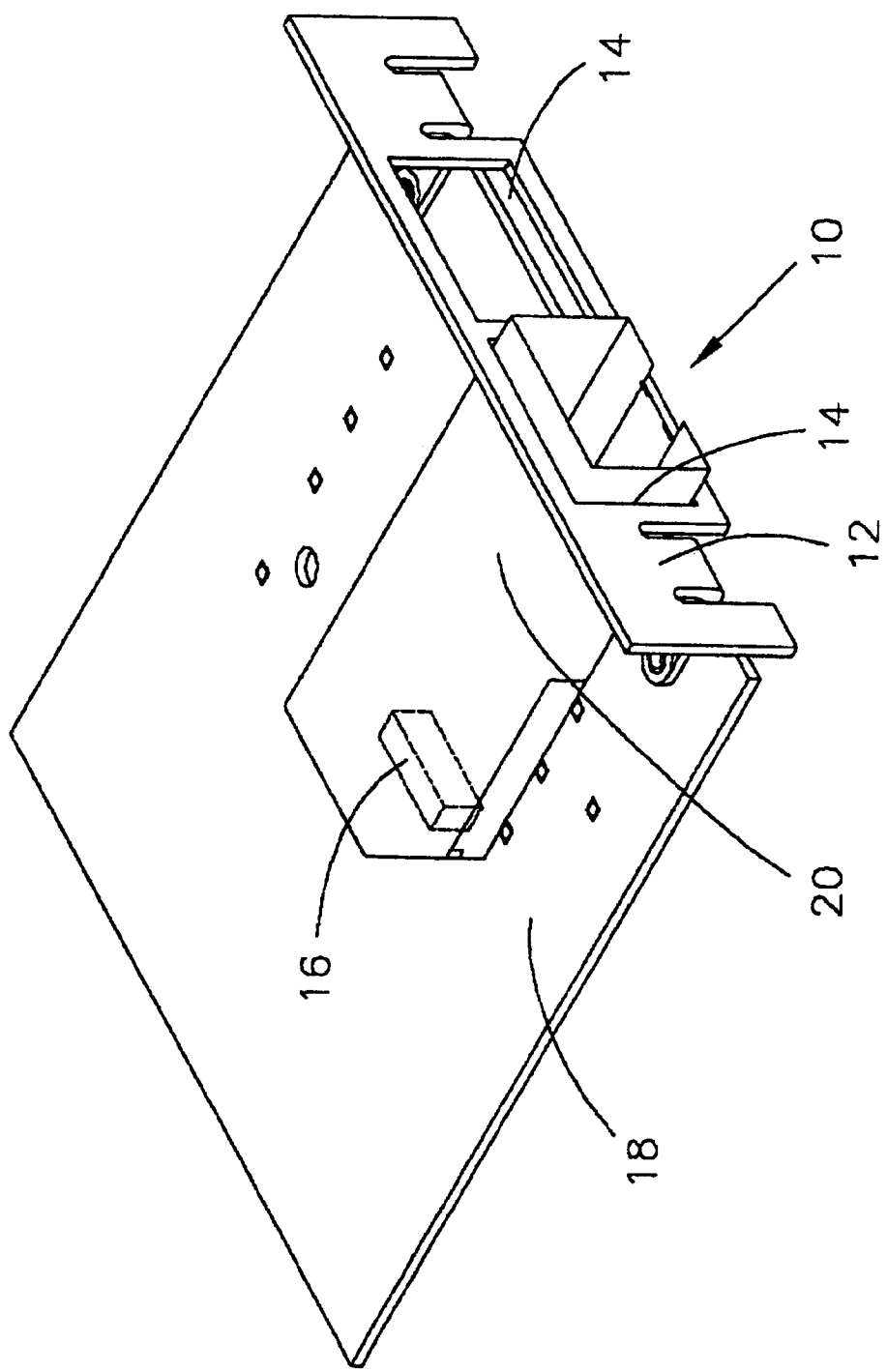
FIG. 1 is an isometric view of the bezel electronic circuit board and an electromagnetic shielding cage of an electronic system.
Figure 2:
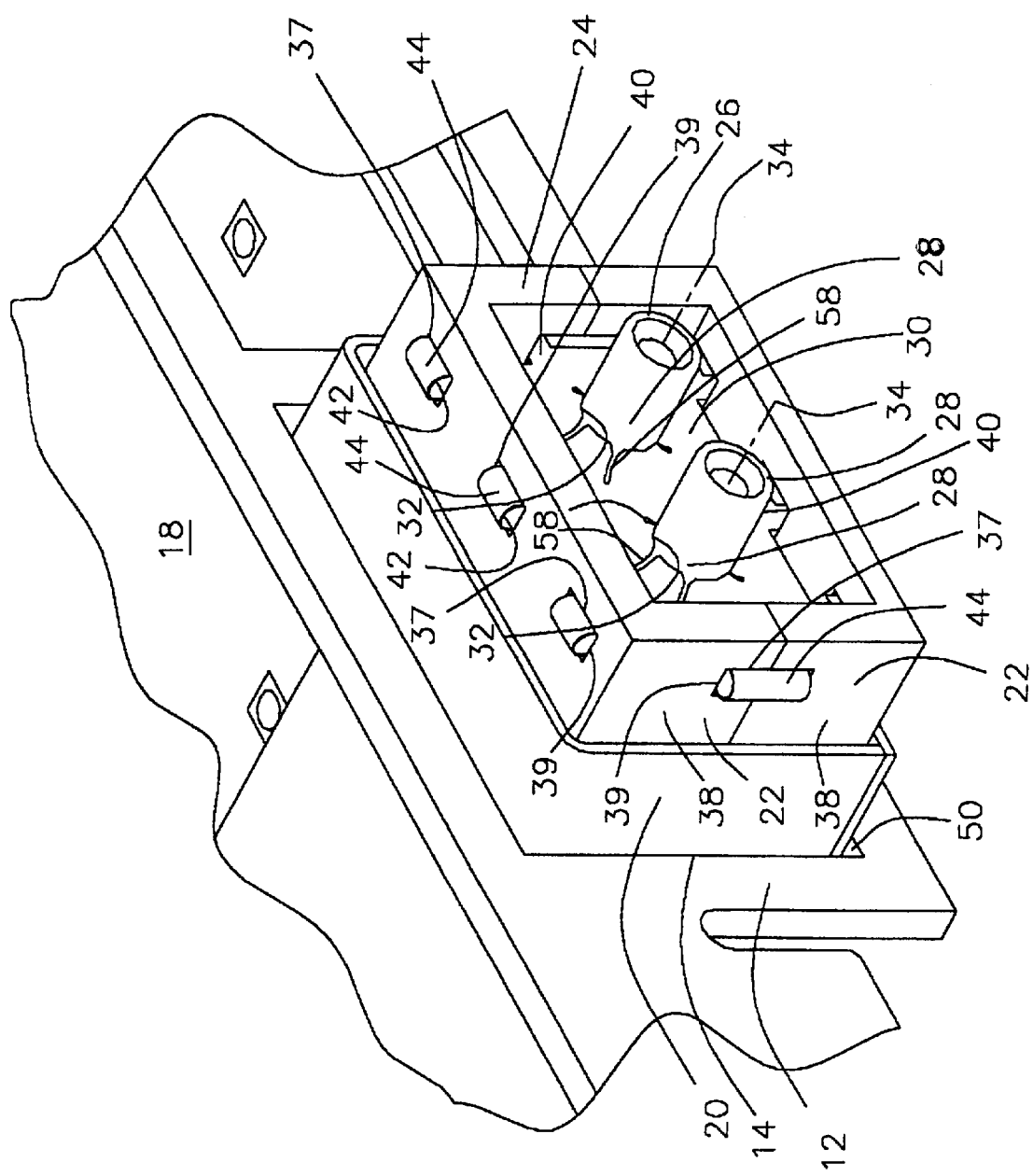
FIG. 2 is an isometric view of the bezel, electromagnetic shielding cage and the transceiver module with the transceiver module partially inserted into the cage.

The invention is described for purposes of disclosure and not by way of limitation by reference to the drawings with initial reference to FIGS. 1 and 2.

In order to shield, attenuate and suppress the escape of electromagnetic radiation (EMR) through an opening 14 in the housing 12 of an electronic system 10, such as a computer or server, opening 14 should be further shielded by an electromagnetic radiation shield 20 which permits the insertion of a data communications transceiver module 22. This additional shielding is necessary because of the need to locate connection interfaces and conductors outside the confines of the internal shielding used with the system housing 12; interfaces and conductors inherently radiate electromagnetic radiation.

A data transmission connector 16 mounted on the electronic circuit board 18 of electronic system 10 may be partially enclosed within a grounded electromagnetic shield or cage 20 to permit the insertion of a transceiver module 22 into a communication port 14 for connection with the connector 16. While the cage 20 will act to block, attenuate or suppress escape of electromagnetic radiation from the electronic components within the electronic system 10 outside the cage 20, cage 20 is not effective to block electromagnetic radiation originating from the connector 16 or from the electronic components and conductors within the transceiver module 22 if the electronic system is operating and the transceiver module 22 is installed.

FIG. 2 shows the transceiver 22 partially inserted into the cage 20. Once fully inserted, the wiping contacts 44 of the spring extensions 40 make electrical grounding connections with the system cage 20, which is connected to machine ground.

In order to prevent or attenuate the escape of electromagnetic radiation generated by the connector 16 and associated conductors of the transceiver module 22 from the front exposed end 24 of the transceiver module 22 and the surfaces 26 of opto-electronic transceivers, two apertures 32 are installed in an electromagnetic shield 30 which encircles the connection barrels 28 of transceivers 22. The plane of the shield 30 is disposed substantially orthogonal to the central longitudinal axes 34 of the barrels 28. When properly connected to electronic ground of the electronic system 10, the shield 30 will suppress a substantial amount of electromagnetic radiation escaping through the exposed end 24 of transceiver module 22.

Figure 3:
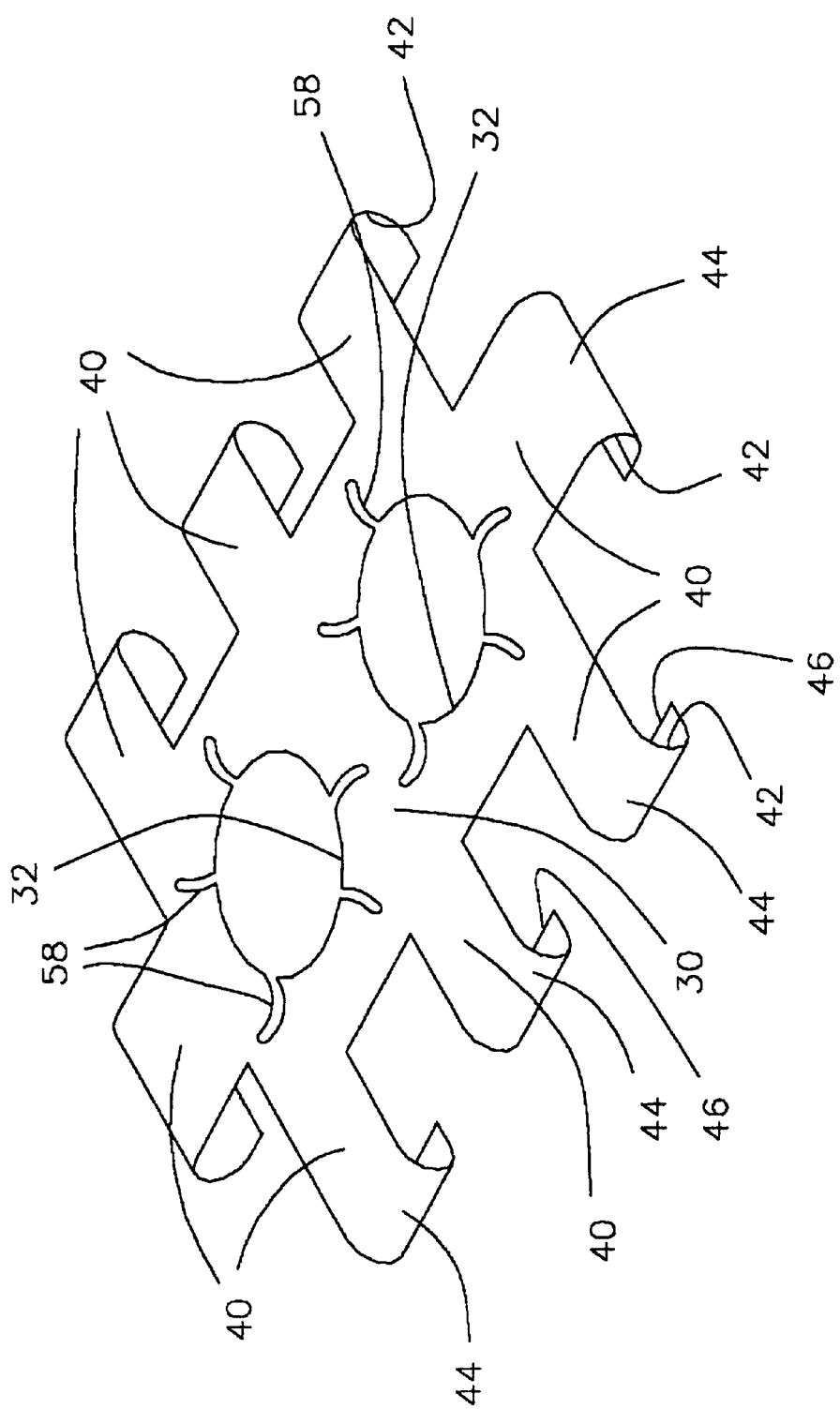
FIG. 3 is an isometric view of the shield of the invention.
Figure 4:
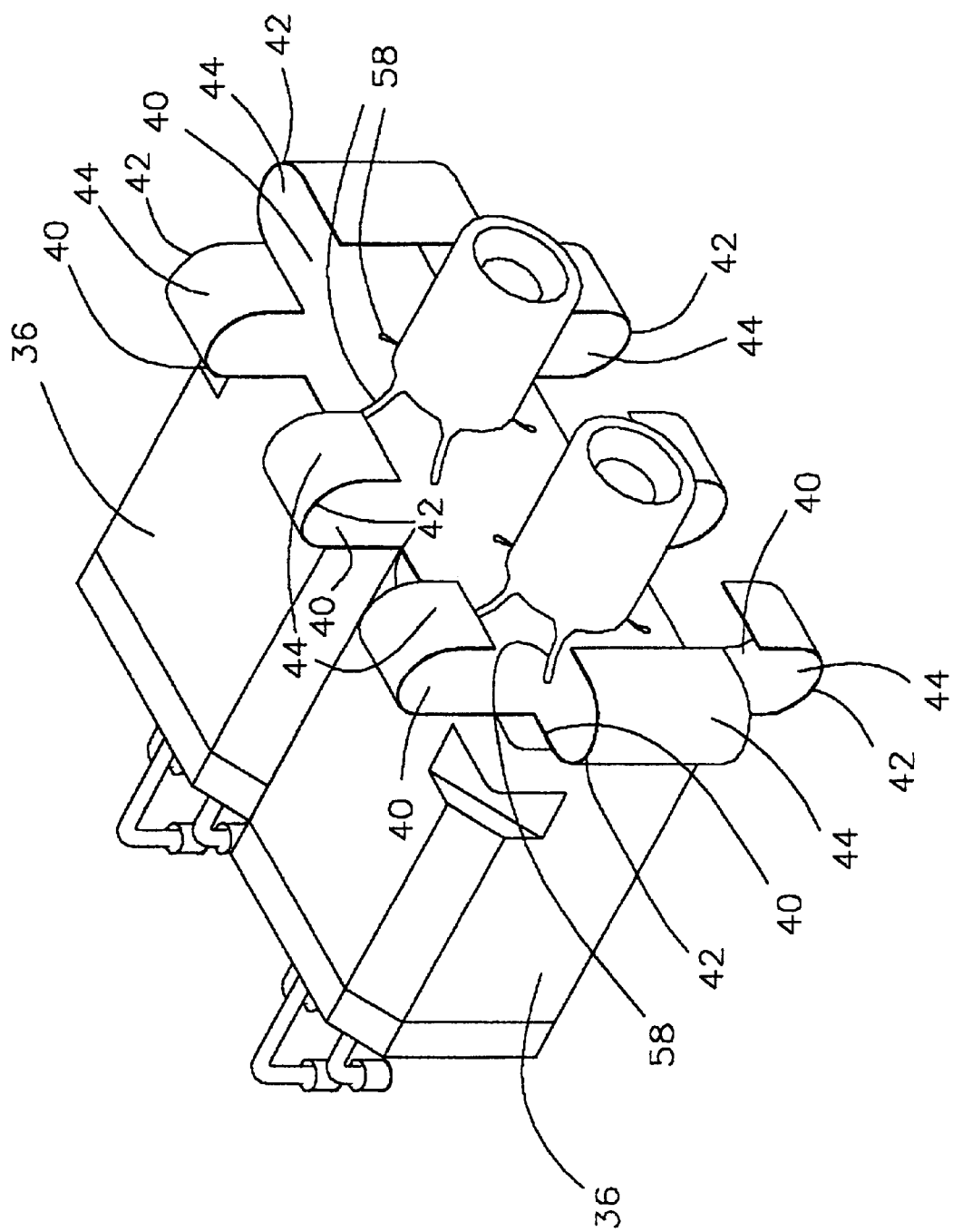
FIG. 4 is an isometric view of the shield of the invention assembled with the optical subassemblies of the transceiver modules in FIG. 3.
Figure 5:
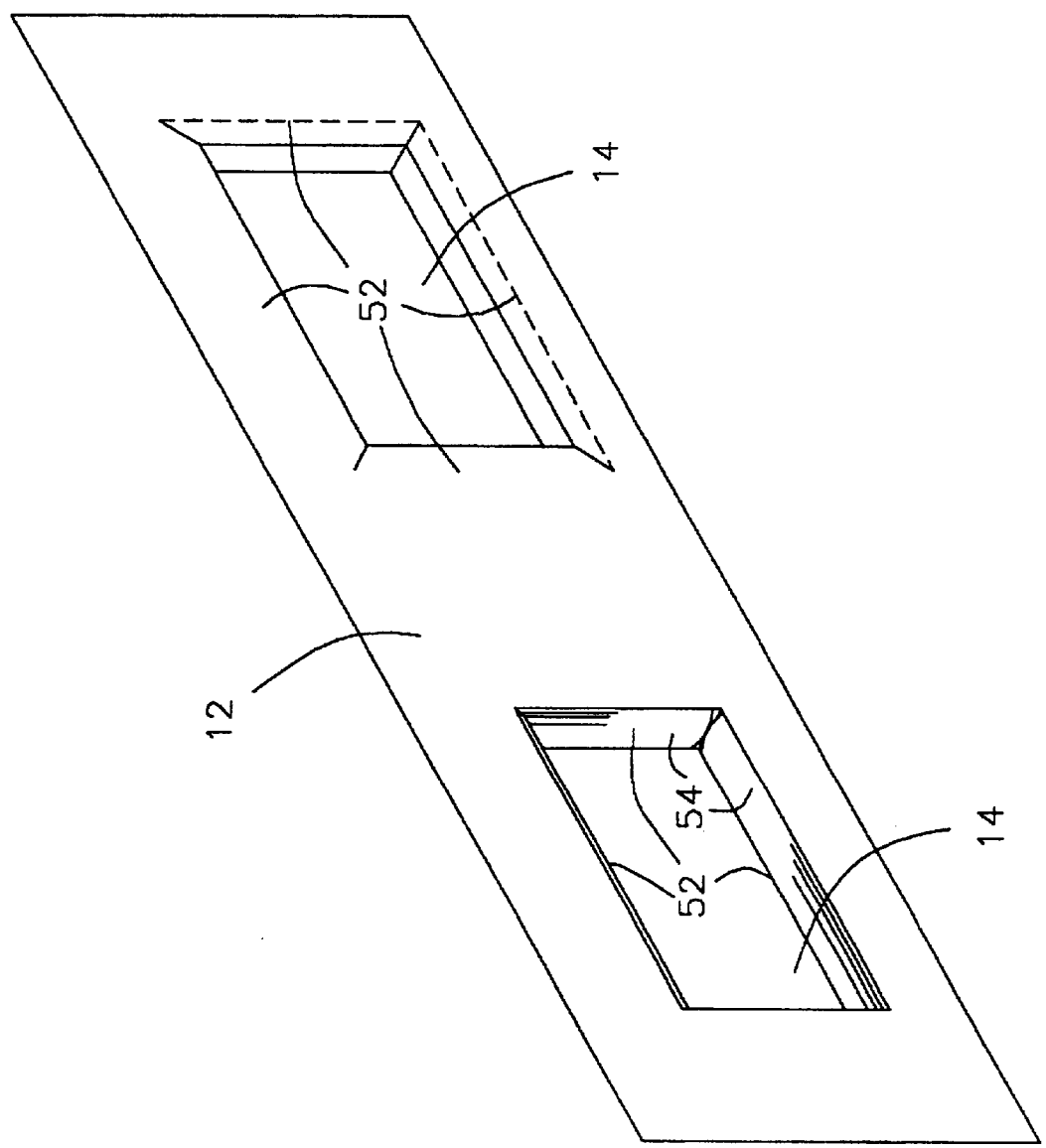
FIG. 5 is an isometric view of the bezel with the communication port openings cut or cut and formed to form engagement surfaces for the shield of the invention.

In order to ground the shield 30 effectively and efficiently yet simultaneously reduce the electromagnetic radiation escaping around the periphery of the shield 30, extensions 40 of the shielding material are formed to project outwardly from the various edges of shield 30 and are best viewed in FIGS. 3 and 4.

Continuing with reference to FIGS. 3 and 4, extensions 40 are preferably shaped and formed to create a smooth curve 42 so as to form a generally semi-cylindrical form with the axis of the semi-cylindrical form 44 approximately parallel to the engaging surface 44 of the shield extensions 40. The extensions 40 and "formed-bend" 42 of the distal end 46 of the extension 40 form both a spring and a wiping contact surface 44 engageable with the electromagnetic radiation shield or cage 20 in FIGS. 1 and 2. The curved wiper contact surface 44 will engage the cage 20 surrounding the connector interface device 16 on the system circuit board 18, which is itself grounded, whenever the transceiver module 22 is inserted and connected to the connector 16. The rounded contact surfaces 44 act to wipe the engaging interior surface of the cage 20 containing the connector 16. Electromagnetic radiation shield 20 surrounding the connector 16 engages and, thus, the wiping action tends to break through any thin layer of corrosion or oxidation which may have formed either on the curved contact surface 44 or on the engaging surface of shield 20. The shield or shield plate 30 is carried, along with the transceiver optical or opto-electronic subassemblies 36, by a transceiver module 22.

The housing of transceiver module 22 is typically a molded plastic material and structure which may be assembled of two or more parts as depicted in FIG. 2. The preferred embodiment is two mating parts or shells 38 which form the transceiver module 22 and which either have or form openings 39 around the periphery of the module 22. The extensions 40 of the electromagnetic radiation shield 30 extend into and protrude through the openings 39. This arrangement serves to retain the shield plate 30 and the transceiver optical subassemblies 36 in position within the transceiver module 22 and further provides a surface engagement between the edge 37 of the opening 39 and the extensions 40, thereby supporting the extensions 40 so that the frictional forces of surfaces 44 engaging cage 20 within the communications port 14 will not deform the spring contacts 44 of extensions 40 to the extent of permanent deformation.

Easy and reliable interchangeability of the transceiver module 22 is enhanced by the spring contacts 44 and transceiver module 22 which provide the capability of repeated insertion and connection or removal and disconnection of module 22 from the electronic system 10.

If either the bezel or system housing 12 or the framework of the housing (not shown) at the location of the communications port 14 is thick enough to provide a sufficient engaging edge surface for contact by the contact surfaces 44 of the extensions 40, the shield or cage 20 surrounding part or all of the connector interface devices may be dispensed with, resulting in a simpler and more cost effective assembly.

Should the thickness of the system housing or bezel 12 not be thick enough for the communications port 14 to provide a wide enough edge surface 50 of bezel 12 to reliably engage the grounding contact surfaces 44 of the extensions 40, flaps or tabs 52 may be formed on the system housing or the bezel 12 as it is punched out or cut from sheet metal and may be cut, either by a stamping machine or laser cutter. Flaps 52 then may be bent inwardly of the bezel housing 12 to extend into the electronic system housing 12, forming communications port opening 14. The flaps or tabs 52 may be bent or formed inwardly, first, to provide a blockage or shield to prevent or attenuate electromagnetic radiation leakage around the inserted and connected transceiver module 22; and, secondly, flaps 52 may be bent inwardly to provide a larger surface 54 for engagement by the grounding contact surface 44 of the extensions 40 of electromagnetic radiation shield 30.

As both rounded contact surfaces 44 and housing 12 are typically electrically connected by the engagement of the rounded contact surfaces 44 onto the bezel 12 or system housing 12, the shield plate 30 and the extensions 40 block or shield the electromagnetic radiation radiated inside the electronic system 10 from escaping through the communication port 14 sufficiently to effectively eliminate electromagnetic interference to other electronic devices.

As mentioned before, if the spring contact surfaces 44 contact the system housing or the grounded conductive bezel 12, the internal shielding around the communications port 14 may be eliminated; a dummy transceiver module and/or electromagnetic radiation shield plate (not shown) may be used whenever a transceiver module 22 and electromagnetic radiation shield plate 30 are not installed in order to control the electromagnetic radiation emissions through the communication port 14.

Figure 6:
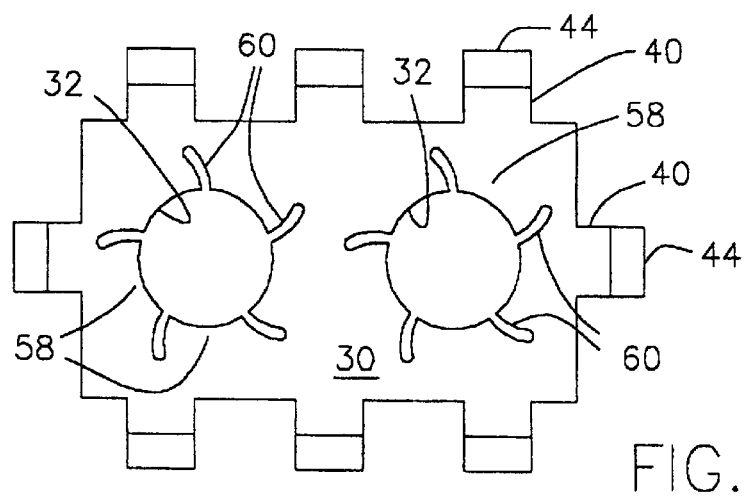
FIG. 6 is a plan view of the shield of the invention with spiral severances cut into the periphery of the apertures of the shield, forming deflectable fingers.
Figure 7:
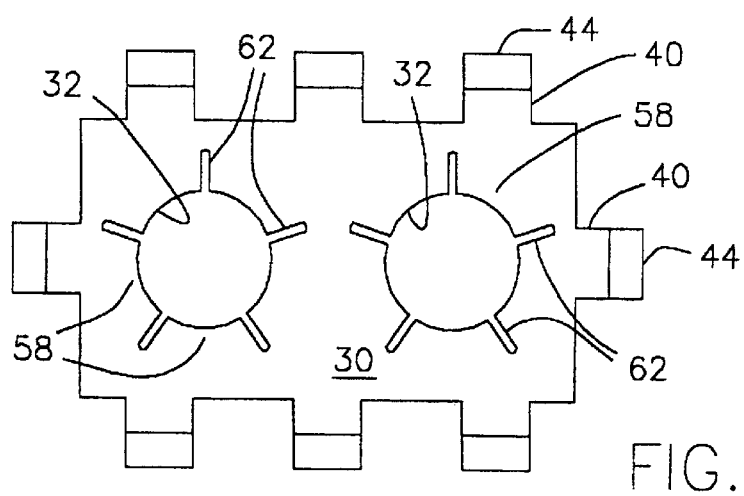
FIG. 7 is a plan view of the shield of the invention with radial severances cut into the periphery of the apertures of the shield, forming deflectable fingers.
Figure 8:
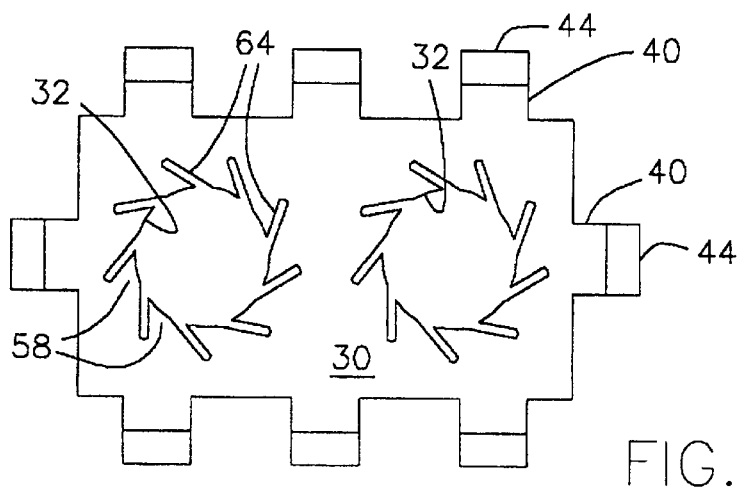
FIG. 8 is a plan view of the shield of the invention with oblique severances cut into the periphery of the apertures of the shield, forming deflectable fingers.

The apertures 32 within the shield plate 30, accommodating the barrels 28 of the opto-electronic transceiver subassemblies 36, may take any number of forms. As dictated by the shape of the barrels 28 of the transceiver optical subassemblies 36 disposed therein, apertures 32 may be circular, as illustrated herein, or may be rectangular. The periphery of the apertures 32 may be made up of the ends of a plurality of flexible fingers 58 formed by cuts or severances 60, 62, 64 (FIG. 6,7,8, respectively) in the electromagnetic radiation shield plate 30 or by uninterrupted peripheries of holes. The fingers 58 may take any of a plurality of forms such as the arcuate cuts 60, radial cuts 62 or oblique cuts 64 illustrated in FIGS. 6, 7 and 8 respectively. The fingers 58 also may make electrical connection and establish grounding to the optical subassemblies 36 if the optical subassemblies 36 are conductive and it is desirable to ground the conductive housings of the optical subassemblies 36.

It is to be understood that the description of this invention is made and illustrated by way of example and is for purposes of disclosure, and the inventors do not intend that the disclosure or description of the invention limit the invention in any manner.

One of skill in the art of electromagnetic radiation control and suppression will recognize that changes and modifications may be made to the disclosed invention and still not be of such a nature as to remove the invention from the scope of the attached claims, which define the scope of protection for the invention.

We claim:

1. An electromagnetic radiation suppression shield for suppressing the escape of electromagnetic radiation from an electronic system of the type designed for receiving a signal transceiver therein, comprising:

an electrically conductive member in a generally planar shape mounted within a housing for said transceiver;

at least one aperture formed in the electrically conductive member of a shape and size to permit a portion of the transceiver to extend therethrough;

a plurality of deflectable members extending from a periphery of said electrically conductive member through an opening in the housing of said transceiver for contacting a portion of the electronic system, each of said deflectable members having a rounded contact surface facilitating repeated insertions and removals of the transceiver from the electronic system;

whereby grounding contact may be made with a surrounding grounded component of said electrical system upon insertion of said transceiver into said electronic system.

2. The electromagnetic radiation suppression shield for suppressing the escape of electromagnetic radiation from an electronic system of claim 1, wherein said deflectable members are extensions of said shield, said deflectable members having proximate portions and distal portions, the distal portions being bent into a substantially semi-cylindrical form.

3. The electromagnetic radiation suppression shield for suppressing the escape of electromagnetic radiation from an electronic system of claim 2, wherein said at least one aperture is defined by at least one interior edge of said electrically conductive member.

4. The electromagnetic radiation suppression shield for suppressing the escape of electromagnetic radiation from an electronic system of claim 3, wherein said at least one aperture is formed to contact said transceiver in a grounding electrical contact.

5. The electromagnetic radiation suppression shield for suppressing the escape of electromagnetic radiation from an electronic system of claim 1, further comprising flexible fingers extending into each aperture for holding the electromagnetic radiation suppression shield in position on the transceiver.

6. The electromagnetic radiation suppression shield for suppressing the escape of electromagnetic radiation from an electronic system of claim 5, wherein the flexible fingers are conductive for grounding the transceiver to the electronic system.

7. The electromagnetic radiation suppression shield for suppressing the escape of electromagnetic radiation from an electronic system of claim 6, wherein the flexible fingers are defined by severances in the electrically conductive member.

8. The electromagnetic radiation suppression shield for suppressing the escape of electromagnetic radiation from an electronic system of claim 7, wherein each severance comprises an arcuate cut, a radially extending cut or an obliquely extending cut in a periphery of an aperture.

9. A communications transceiver assembly for interconnecting a communications network cable to an electronic system, comprising:
- a transceiver module;
- at least one transceiver disposed within said transceiver module;
- an electromagnetic radiation shield disposed exterior to and encircling a portion of said transceiver within the transceiver module; said electromagnetic radiation shield further comprising:
  - an electrically conductive member in a generally planar shape;
  - at least one aperture formed therein of a shape and size to permit a portion of the transceiver to extend therethrough;
  - a plurality of spring members extending from a periphery of said electrically conductive member through said transceiver module and disposed to engage an adjacent member of said electronic system, each of said spring members having a rounded contact surface facilitating repeated insertions and removals of the transceiver module from the electronic system;
- whereby electrical grounding contact is made with an electrically grounded component of said electrical system upon insertion of said transceiver into said electronic system.

10. The communications transceiver assembly for interconnecting a communications network cable to an electronic system of claim 9, wherein said spring members are extensions of said shield, said spring members having proximate portions and distal portions, the distal portions being bent into a substantially semi-cylindrical form.

11. The communications transceiver assembly for interconnecting a communications network cable to an electronic system of claim 10, wherein said at least one aperture is defined by at least one interior edge of said electrically conductive member.

12. The communications transceiver assembly for interconnecting a communications network cable to an electronic system of claim 11, wherein said at least one aperture is formed to contact said transceiver in a grounding electrical contact.

13. The communications transceiver assembly for interconnecting a communications network cable to an electronic system of claim 9, further comprising flexible fingers extending into each aperture for holding the electromagnetic radiation shield in position on each transceiver.

14. The communications transceiver assembly for interconnecting a communications network cable to an electronic system of claim 13, wherein the flexible fingers are conductive for grounding each transceiver to the electronic system.

15. The communications transceiver assembly for interconnecting a communications network cable to an electronic system of claim 14, wherein the flexible fingers are defined by severances in the electrically conductive member.

16. The communications transceiver assembly for interconnecting a communications network cable to an electronic system of claim 15, wherein each severance comprises an arcuate cut, a radially extending cut or an obliquely extending cut in a periphery of an aperture.

17. An electromagnetic radiation suppression shield for suppressing the escape of electromagnetic radiation from an electronic system of the type designed for receiving a transceiver module including a signal transceiver therein, comprising:
- an electrically conductive member in a generally planar shape mounted in the transceiver module;
- at least one aperture formed in the electrically conductive member of a shape and size to permit a portion of the transceiver to extend therethrough;
- flexible fingers extending into each aperture for holding the electrically conductive member in position on the transceiver;
- a plurality of deflectable members extending from a periphery of said electrically conductive member through an opening in the transceiver module;
- whereby grounding contact may be made with a surrounding grounded component of said electrical system upon insertion of said transceiver into said electronic system.

18. The electromagnetic radiation suppression shield for suppressing the escape of electromagnetic radiation from an electronic system of claim 17, wherein the flexible fingers are conductive for grounding each transceiver to the electronic system.

19. The electromagnetic radiation suppression shield for suppressing the escape of electromagnetic radiation from an electronic system of claim 18, wherein the flexible fingers are defined by severances in the electrically conductive member.

20. The electromagnetic radiation suppression shield for suppressing the escape of electromagnetic radiation from an electronic system of claim 19, wherein each severance comprises an arcuate cut, a radially extending cut or an obliquely extending cut in a periphery of an aperture.

* * * * *

UNITED STATES PATENT AND TRADEMARK OFFICE
CERTIFICATE OF CORRECTION

PATENT NO. : 6,744,639 B1
DATED : June 1, 2004
INVENTOR(S) : Branch et al.

It is certified that error appears in the above-identified patent and that said Letters Patent is hereby corrected as shown below:

Column 1,
Line 13, "filed Jan. 1, 2002" should read -- issued Jan. 1, 2002 --
Line 18, "Ser. No. 09/565,096" should read -- Ser. No. 09/565,086 --

Signed and Sealed this

Seventeenth Day of May, 2005

JON W. DUDAS
*Director of the United States Patent and Trademark Office*